United States Patent [19]

Struger

[11] 4,250,563
[45] Feb. 10, 1981

[54] EXPANDABLE PROGRAMMABLE CONTROLLER

[75] Inventor: Odo J. Struger, Chagrin Falls, Ohio

[73] Assignee: Allen-Bradley Company, Milwaukee, Wis.

[21] Appl. No.: 65,119

[22] Filed: Aug. 9, 1979

[51] Int. Cl.³ .............................................. G06F 9/06
[52] U.S. Cl. ................................. 364/900; 371/51; 361/393
[58] Field of Search ................. 364/900; 371/51; 361/393, 394, 413

[56] References Cited

U.S. PATENT DOCUMENTS

| | | | |
|---|---|---|---|
| 3,942,077 | 3/1976 | Powers | 361/393 |
| 3,942,158 | 3/1976 | Dummermuth | 364/900 |
| 4,095,094 | 6/1978 | Struger et al. | 371/18 |
| 4,118,789 | 10/1978 | Casto et al. | 364/900 |
| 4,122,519 | 10/1978 | Bielawski et al. | 364/900 |
| 4,165,534 | 8/1979 | Dummermuth et al. | 364/900 |

*Primary Examiner*—Charles E. Atkinson
*Attorney, Agent, or Firm*—Quarles & Brady

[57] ABSTRACT

A programmable controller with a processor module, one or more I/O modules and a rack in which the modules are supported, is expanded by replacing the processor module in a lead slot with a rack adapter module that connectes to a separate processor unit. The rack unit is converted from a controller rack to one of several I/O interface racks that can be connected to the separate processor unit. The removable processor module integrates the processing functions of the separate processor unit and the parity checking, decoding and buffering functions of the rack adapter module. The rack enclosure provides a universal connecter between the I/O modules and the module selected for insertion into the lead slot.

7 Claims, 7 Drawing Figures

U.S. Patent  Feb. 10, 1981  Sheet 1 of 6  4,250,563
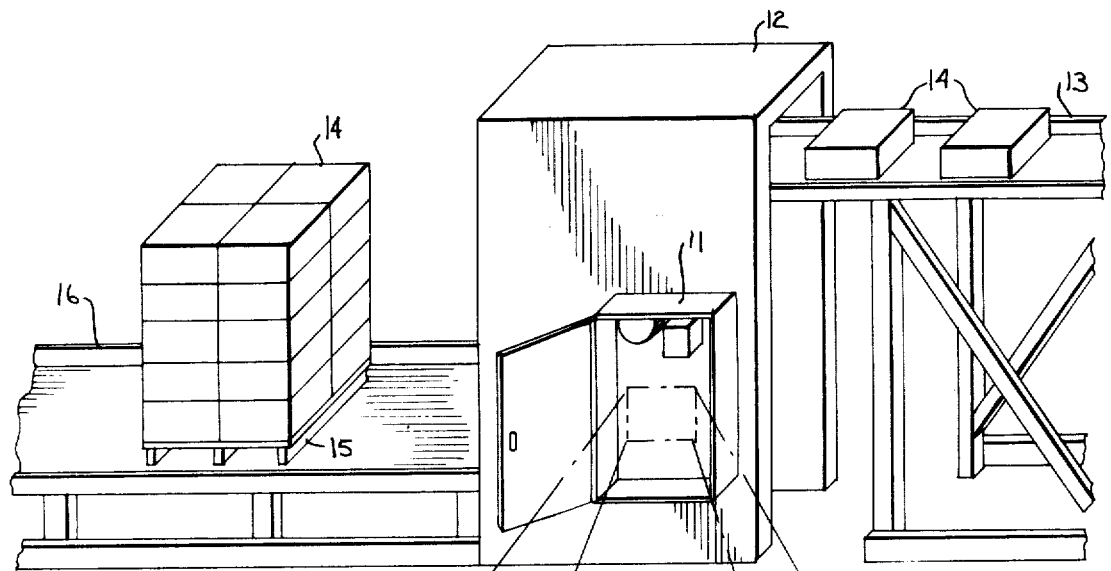
fig. 1
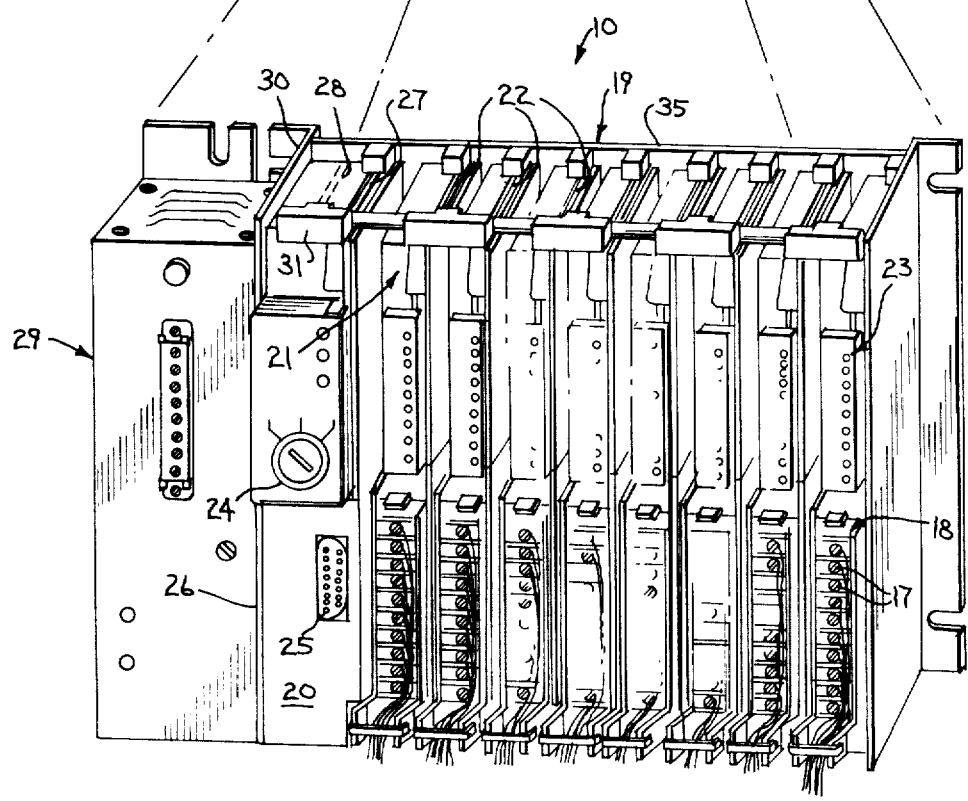

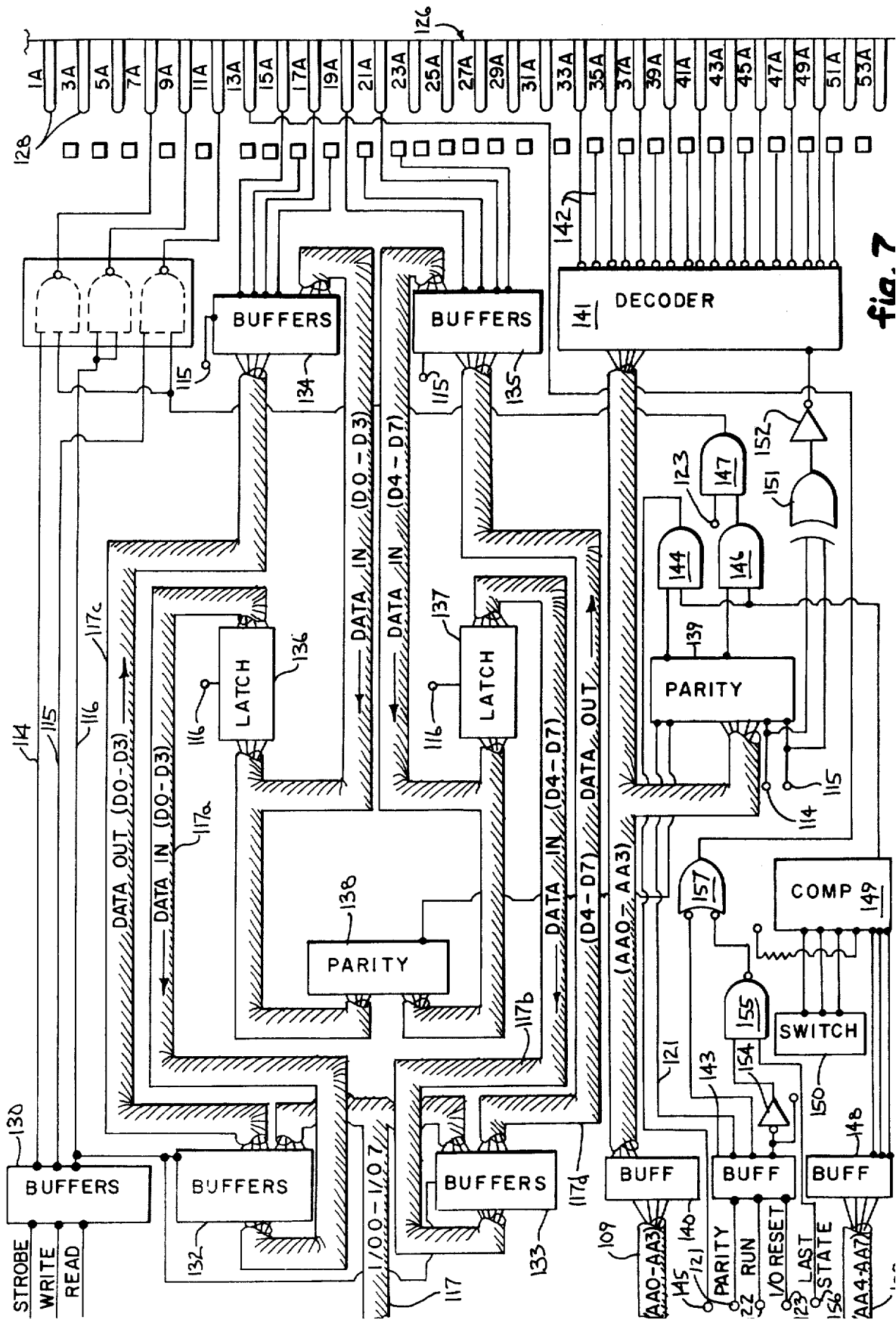

4,250,563

EXPANDABLE PROGRAMMABLE CONTROLLER

BACKGROUND OF THE INVENTION

1. Field of the Invention

The field of the invention is digital controllers, and more particularly, programmable controllers used to monitor and direct the operation of industrial machines and processes.

2. Description of the Prior Art

Programmable controllers are being used in a growing variety of industrial applications. Controllers such as disclosed in Dummermuth, U.S. Pat. No. 3,942,158, issued Mar. 2, 1976, have been used to perform large control tasks, such as supervising an entire assembly line or industrial process from beginning to end.

Now that programmable controllers have been proven in such large applications, industry is converting from old technology electromechanical controls to the new programmable controls for many smaller operations. In an allowed application of Dummermuth et al, U.S. Pat. No. 4,165,534, issued Aug. 21, 1979, a smaller controller with a microprocessor-based processor unit is disclosed. This controller has recently been retrofitted with an I/O interface rack of the type disclosed in Struger et al, U.S. Pat. No. 4,151,580, issued Apr. 24, 1979, which is less expensive and less elaborate than the rack of the controller in U.S. Pat. No. 3,942,158. This controller now provides a physically smaller, less expensive option of the first controller discussed above, while still providing the control capacity for a large number of industrial tasks.

There are still applications, however, where a smaller controller could be used. Some potential users, however, might be reluctant to invest in small controllers, where a growth in production demand and capacity could render such small controllers unusable or obsolete. Therefore, programmable controllers must become part of a controller system that provides the full range of controller capabilities through a set of compatible processors and I/O interface equipment of varying capacities.

SUMMARY OF THE INVENTION

The invention is an expandable programmable controller system in which a processor module and at least one I/O module are disposed in a rack enclosure and connected through edge connectors and a back plane circuit board on which the edge connectors are mounted. The system is expanded by removing a processer module from a lead slot and inserting a rack adapter module into that slot, to convert the rack from a processor rack to an I/O interface rack for a larger controller. A separate processor unit is then connected to one or more such I/O interface racks through the rack adapter module in each rack.

The key elements of the system are the processor module and a rack which accepts either the processor module or the rack adapter module in a special slot, called a "lead" slot herein. The processor module includes a memory for storing the control program, a main processor coupled to the memory for executing the control program, and address and data buses, which in the separate processor unit are terminated in a mass input/output termination. In the processor module, however, the address bus is coupled to a decoding circuit, which itself is coupled to I/O module enable lines that terminate along the back edge of the processor module. In prior controllers, this decoding circuitry was included in the rack adapter module with parity checkers, latches and buffers. The processor module of the present invention provides the necessary parity checking and buffering between its main processor and the I/O back plane.

The other key element of the present invention is the multipurpose rack which has a lead slot with universal edge connection means for connecting either a processor module or a rack adapter module to the I/O modules in the rack. When a rack adapter modules is inserted into the lead slot, the rack may be only one of several racks connected to the separate processor unit. Thus, the controller is expandable from a single-rack, self-contained controller to a controller with multiple I/O interface racks. Separate processor units of different capacity can be connected to the I/O interface racks to further expand the capacity of the controller. The rack adapter may further include circuitry for communication of serial data between the I/O interface racks and the separate processor unit, whereby the I/O interface racks can be located sizable distances from the processor unit.

One object of the invention is to provide a processor module that can be directly connected to I/O modules rather than through an interfacing rack adapter module.

Another object of the invention is to provide a small programmable controller that can be housed in a single rack enclosure.

Another object of the invention is to provide a rack enclosure with a lead slot for connecting either of two modules, a processor module or a rack adapter module, to the I/O modules in the rack.

Another object of the invention is to provide a rack enclosure that functions as either a processor rack or an I/O interface rack.

Another object of the invention is to provide a processor module that performs the functions of both a processor and a rack adapter module.

The foregoing and other objects and advantages of the invention will appear from the following description. In the description reference is made to the accompanying drawings which form a part hereof, and in which there is shown by way of illustration a preferred embodiment of the invention. Such embodiment does not necessarily represent the full scope of the invention, however, and reference is therefore made to the claims for interpreting the scope of the invention.

BRIEF DESCRIPTION OF THE DRAWINGS

FIG. 1 shows a programmable controller housed within a single rack and connected to a case palletizer;

FIG. 7 is a block diagram of a rack adapter module from FIG. 2 showing the connections between the module circuitry and terminals along the back edge of a rack adapter circuit board.

DETAILED DESCRIPTION OF THE PREFERRED EMBODIMENT

Figure 2:
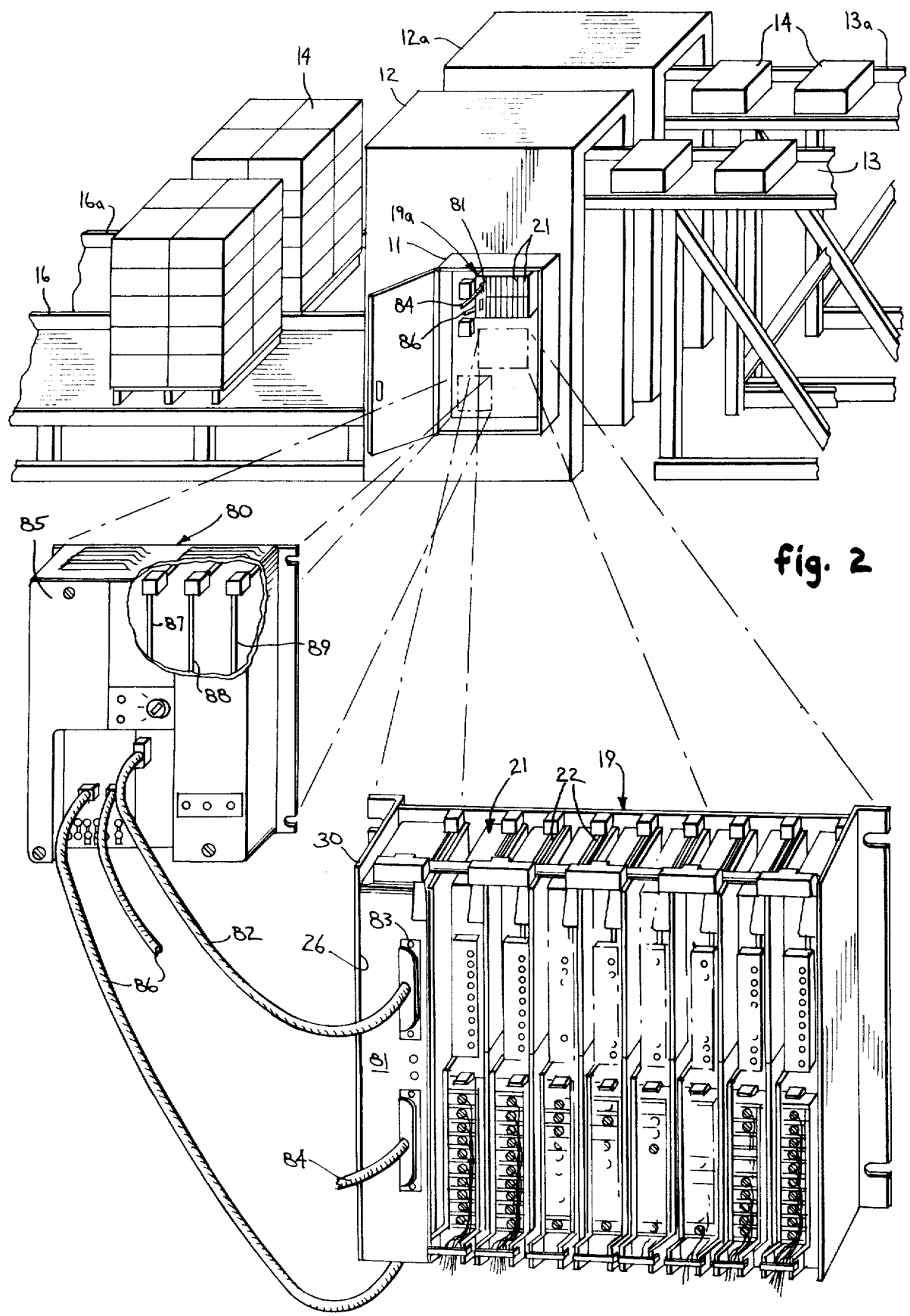
FIG. 2 is a programmable controller with a separate processor unit and two I/O interface racks connected to a pair of case palletizers.

Referring to FIG. 1, an expandable programmable controller 10 that incorporates the present invention is mounted in a general purpose enclosure 11 on the side of a case palletizing machine 12. An incoming conveyor 13 carries cases 14 into an entrance to the palletizer 12, and these cases 14 are shifted and arranged by a pusher bar (not shown) within the palletizer 12. As the cases are loaded, a pallet 15 such as the one seen on the exit side of the palletizer 12, is lowered within the palletizer 12 in elevator fashion so that one layer of cases may be stacked on the next, until the pallet 15 is fully loaded. The loaded pallet 15 is then moved out of the palletizer 12 on an exit conveyor 16. This operation requires a series of photocells, limit switches, selector switches and pushbutton controls that provide inputs to the controller 10, and further requires solenoid-operated hydraulic valves, motor starters, pump drives and pattern switches that are responsive to outputs from the controller 10.

These input and output devices are wired to terminals 17 on swing arm connectors 18 on the front of the controller 10. The controller 10 is housed in a rack enclosure 19 which holds a processor module 20 and eight I/O modules 21. Each I/O module 21 includes a circuit board 22 that is held in a closely spaced, upright and substantially parallel position with the other I/O circuit boards 22 in the rack enclosure 19. The I/O circuit boards 22 include either a set of eight input circuits or a set of eight output circuits which directly monitor or control the I/O devices on the palletizer 12. Input circuits which are suitable for this purpose are disclosed in U.S. Pat. Nos. 3,643,115 and 3,992,636, and output circuits which are suitable for this purpose are disclosed in U.S. Pat. No. 3,745,546. A set of status indicator lights 23 is mounted along the upper front edge of each I/O circuit board 22 and the swing arm connectors 18 are each connected to the lower front edge of a respective I/O circuit board 22. Certain aspects of the rack enclosure 19 have been disclosed previously in Struger et al, U.S. Pat. No. 4,151,580, issued Apr. 24, 1979, and assigned to the assignee of the present invention.

The processor module 20, with a key switch 24 and an outwardly facing pin-style connector 25, is positioned in a leftmost slot 26 in the rack enclosure 19, and includes a processor motherboard 27 and a daughter-board 28 mounted piggyback on the motherboard 27. A power supply 29 is mounted on a left side wall 30 of the rack enclosure 19 and supplies power to the modules 20 and 21 in the controller 10.

Figure 3:
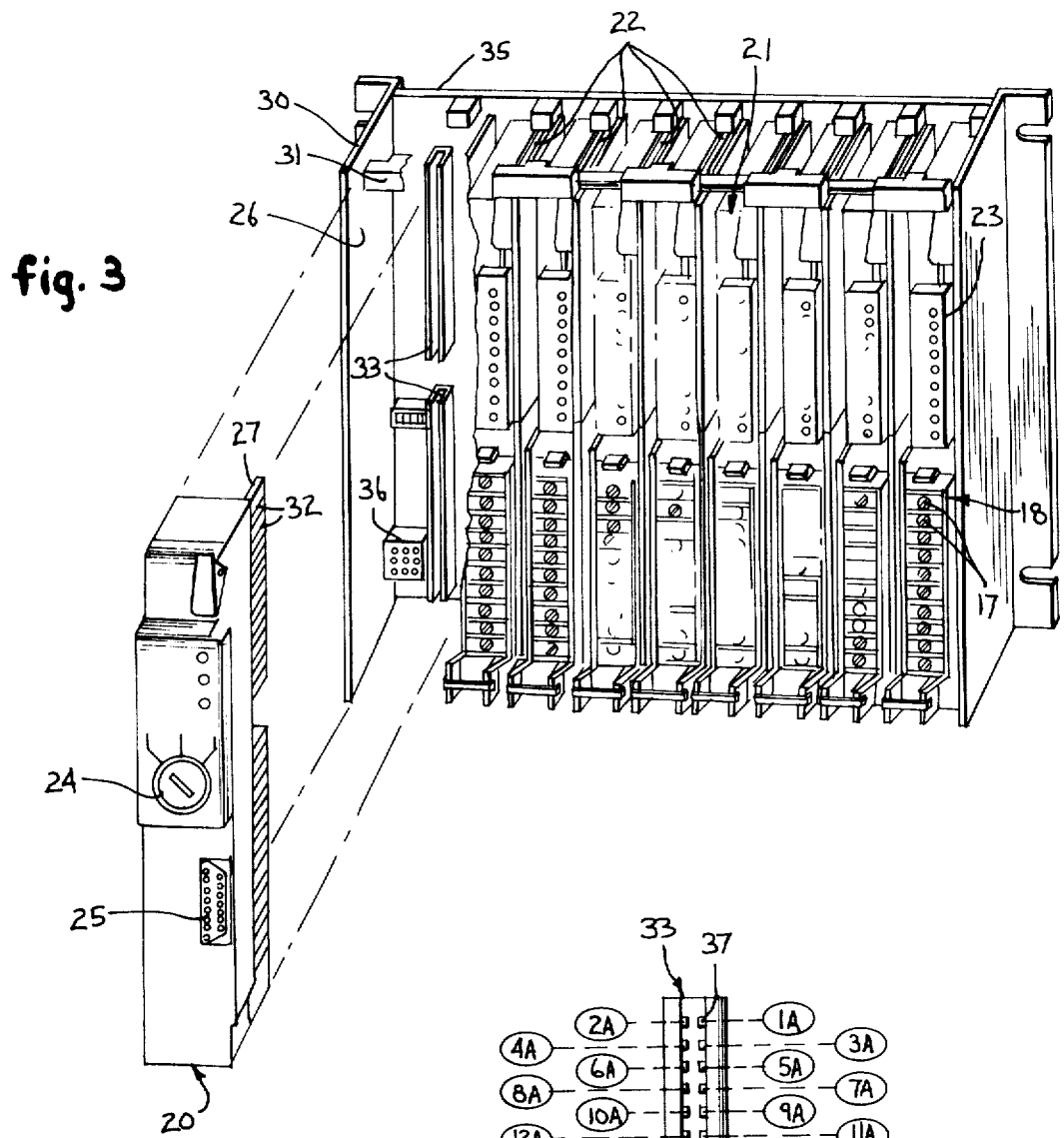
FIG. 3 is an exploded view of the controller of FIG. 1 with the processor module removed and with a portion of the rack enclosure broken away to show the I/O back plane.

Referring now to FIGS. 1 and 3, the processor module 20 can be removed from the rack enclosure 19 by lifting a circuit board latch 31 seen in FIG. 1 and removing the module 20 as seen in FIG. 3. The processor motherboard 27 has a plurality of termination areas 32 formed along its back edge as seen in FIG. 3, and these termination areas 32 are inserted into pair of 54-pin edge connectors 33 within the leftmost or "lead" slot 26 in the rack enclosure 19. The edge connectors 33 are mounted on a circuit board 35 called a back plane motherboard that extends across the back of the rack enclosure 19 and electrically connects the edge connectors 33 seen in FIG. 3 to other edge connectors (not shown) contacting the back edges of the I/O circuit boards 22. The power supply 29 of FIG. 1 is connected to the back plane 35 through a plug receptacle 36 seen in FIG. 3.

Figure 4:
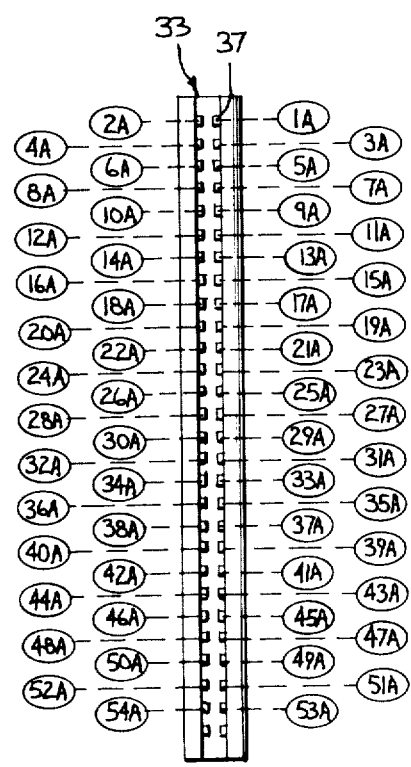
FIG. 4 is a frontal view of a back plane connector from FIG. 3 with pin connections identified.
Figure 5:
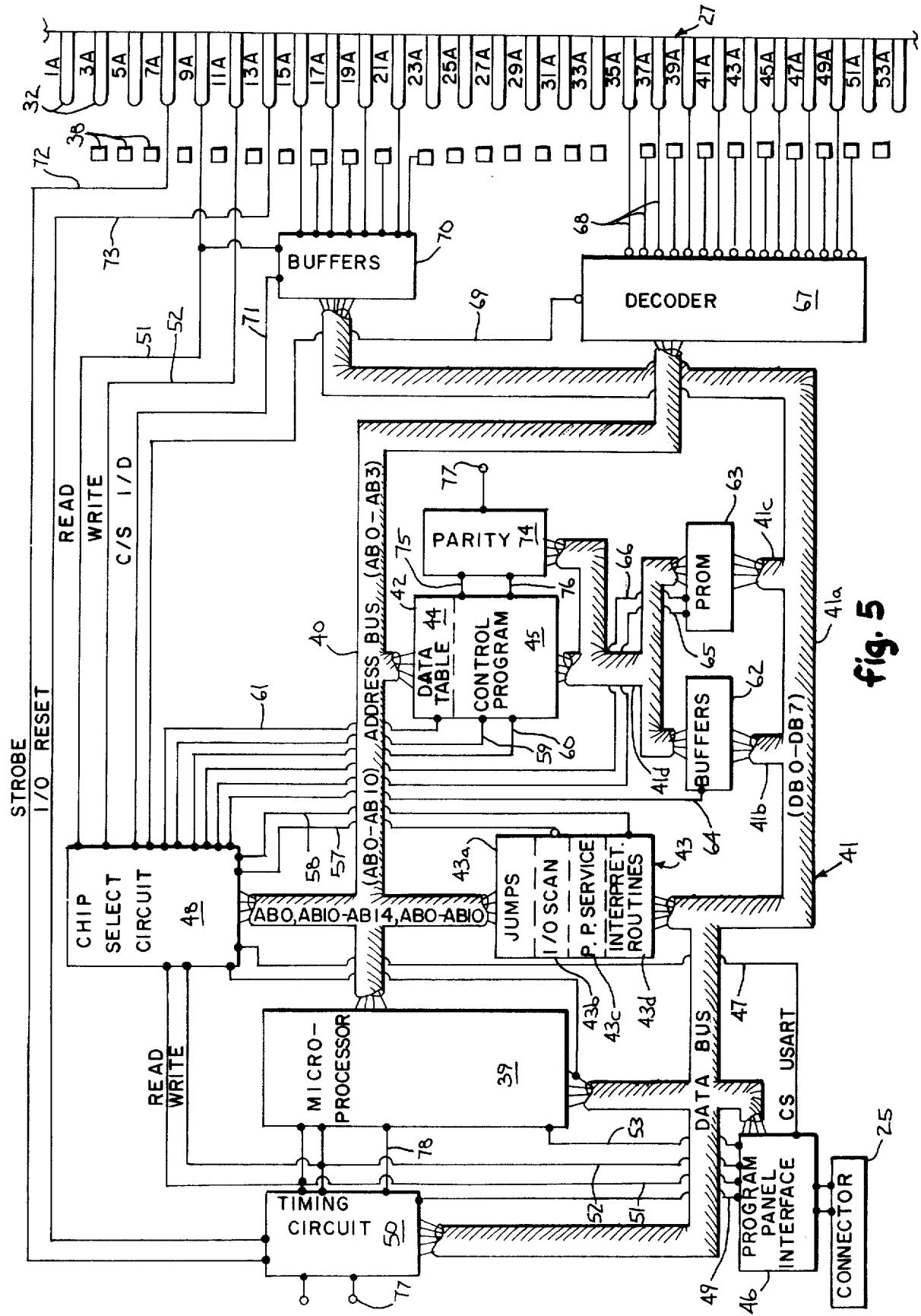
FIG. 5 is a block diagram of a processor module in the programmable controller of FIG. 1 with circuits connected to terminals along the back edge of a processor module circuit board.

Referring to FIGS. 3, 4 and 5, each termination area 32 on the processor motherboard 27 has a number from 1 to 54 followed by a suffix "A" or "B," the uppermost edge connector 33 in FIG. 3 being the "A" connector and the lowermost edge connector 32 being the "B" connector. The numbering of these termination areas 32 corresponds to the numbering of contacts 37 within the "A" connector 33, as seen in FIG. 4. The odd-numbered (1A-53A) termination areas 32 are located on a component side of the processor motherboard 27 as seen in FIG. 5, and the even-numbered (2A-54A) termination areas 32 are located on a solder side of the motherboard 27, and consequently, are not seen in the drawings. These termination areas 2A-54A are, however, connected to circuitry in FIG. 5 through holes 38 filled with conductive material and printed wires (not shown) on the solder side of the motherboard 27. Therefore, it should be apparent that the contacts 37 along one side of the connector 33 in FIG. 4 connect to the odd-numbered (1A-53A) termination areas 32 and the contacts on the other side of the connector 33 connect to the even-numbered (2A-54A) termination areas 32 on the solder side of the processor motherboard 27.

Referring to FIG. 5, a microprocessor 39 in the main processor module 20 is connected through lines AB-0–AB10 of a sixteen-line address bus 40 and by an eight-bit (DB0–DB7) data bus 41 to a random access memory (RAM) 42 and an interpreter memory 43 comprised of programmable read-only memory (PROM) chips. The RAM 42 stores a data table 44 and a control program 45 of macro-instructions that direct the controller 10 to examine the status of the input devices on the palletizer 12 and to control the status of the output devices thereon. Status data is coupled between the I/O modules 21 and the data table 44 through the execution of an I/O scan routine, during which the status of input devices is read into the data table 44 in the RAM 42, and the status of controlled output devices is coupled from the data table 44 to the output circuits in the I/O modules 21.

The control program instructions stored in the RAM 42 are those familiar to users of programmable controllers. These instructions have been developed with the art into a relatively standard set of program instructions. These instructions perform operations which are known by mnemonics such as XIC, XIO, BST, BND, GET, PUT and TON 0.1 to name a few. These instructions are not directly recognized by microprocessors, because each microprocessor has its own instruction set devised by its respective manufacturer. In this example, the microprocessor 39 is a Z80-A microprocessor available from Zilog, Inc. For the instruction set of this microprocessor 39, as well as a description of its architecture and operation, reference is made to the Z80-CPU Technical Manual, copyright 1976 by Zilog, Inc.

The data table 44 and the control program 45 are stored in the read/write RAM memory 42, so that status data and user program instructions can be easily updated and revised. Instructions of the microprocessor 39, on the other hand, are not ordinarily altered in the field and nonvolatile storage of such instructions is desirable. Therefore, microprocessor instructions are stored in the interpreter PROM 43, which has a capacity of 4K data words of eight bits, each word being stored in a separately addressable location.

The microprocessor 39 operates in a manner disclosed in a copending application of Brown et al, Ser. No. 43,897, filed May 30, 1979, and assigned to the assignee of the present invention. Microprocessor machine instructions are stored in the interpreter PROM 43 and organized in interpreter routines 43d. A FETCH routine is incorporated in each of the interpreter routines 43d to fetch the next macro-instruction from the RAM 42. Each macro-instruction in the RAM 42 is in fact an address in a jump table 43a in the interpreter PROM 43, and a jump instruction in the jump table 43a couples each control program instruction to one of the interpreter routines in the PROM 43. The interpreter PROM 43 also stores the I/O scan routine 43b and a program panel service routine 43c for coupling data between the RAM 42 and a program panel (not shown).

The control program can be loaded, edited and displayed by connecting a program panel of the type well known in the art to the connector 25 seen in FIG. 1. As shown schematically in FIG. 5, this connector is coupled to a program panel interface 46 in the processor module 20. The program panel interface 46 couples the connector 25 to the data bus 41 so that data can be coupled between the program panel and the RAM 42. The panel interface 46 includes a USART, of the type commonly known, which is enabled through a CS USART line 47 connecting it to a chip select circuit 48. The interface 46 is also connected through a two-megahertz clock line 49 to a timing circuit 50, and through a read line 51 and a write line 52 to the microprocessor 39. After data is entered through the program panel, an interrupt signal is transmitted to the microprocessor 39 through an interrupt line 53, and the program panel service routine is executed to control communication between the program panel and the RAM 42.

Still referring to FIG. 5, the microprocessor 39 is connected through lines AB0 and AB10-AB14 to the chip select circuit 48. Signals on lines AB0 and AB11-14 are decoded by the chip select circuit 48 to selectively enable other hardware in the processor module 20. For example, the chip select circuit 48 is connected by the PROM 1 and PROM 2 enable lines 57 and 58 to enable 2K blocks of the interpreter PROM 43. Similarly, the chip select circuit 48 is connected by RAM 1 and RAM 2 enable lines 59 and 60 to enable 1k × 8-bit sections of the RAM 42. In addition, the chip select circuit 48 is connected by a RAM enable line 61 to enable a 4k × 1-bit section of the RAM 42 which stores the parity of the data in the 2k × 8-bit section.

Data is read into the RAM 42 through an input branch 41b of the data bus 41 and a set of buffers 62 in this branch 41b. Data is read out from the RAM 42 through an output branch 41c of the data bus 41 and a translator PROM 63 connected in this branch. The input branch 41b and the output branch 41c, both stem from a main branch 41a of the data bus 41, and are both connected by a two-way branch 41d of the data bus 41 to the RAM 42. The buffers 62 are enabled through a buffer enable line 64 connecting them to the chip select circuit 48, and the translator PROM 63 is enabled through a translator PROM enable line 65 connecting it to the chip select circuit 48. A translating mode line 66 also connects the chip select circuit 46 to the translator PROM 63, and signals on this line control the mode of operation for the translator PROM 63. For further details concerning the translator PROM 63, as well as the chip select circuit 48 and the timing circuit 50, reference is made to the copending application of Brown et al, Ser. No. 43,897, cited above.

The invention relates to the hardware that enables the coupling of data between a processor and the I/O modules 21 during the I/O scan routine. To couple data to a specific one of the I/O modules 21, the module 21 must be enabled while the other modules are disabled. As seen in FIG. 5, lines AB0-AB3 of the address bus 40 are coupled through a 4-line-to-16-line decoder 67 to sixteen I/O module enable lines 68. These I/O module enable lines 68 connect to sixteen termination areas 35A-50A on the back edge of the processor motherboard 27. The first I/O module 21 to the right of the processor module 20 in FIG. 3 connects through its edge connector, which is of the type shown in FIG. 4, to pin 35A of the processor edge connector 33 in FIG. 4, and to termination area 35A in FIG. 5. Similarly, the other seven I/O modules 21 shown in FIG. 3 have enable lines 68 connecting to termination areas 36A-42A on the processor motherboard 27. The rack enclosure 19 of FIGS. 1 and 3 can be a different sizes, for housing up to sixteen I/O modules 21. Therefore, enable lines 68 and termination areas 43A-50A are provided for eight more I/O modules 21. The decoder itself is enabled through a decoder enable line 69 connecting it to the chip select circuit 48.

As seen in FIG. 5, data is coupled between the data bus 41 and the back plane 35 through a set of buffers 70 and termination areas 15A-22A. The buffers 70 are enabled through a CS I/O line 71 connecting the chip select circuit 48 to the buffers 70. The read line 51 connects the microprocessor 39 to the chip select circuit 48, and also connects the chip select circuit 48 to the buffers 70, to control the direction in which the buffers 70 are enabled. The read line 51 and the write line 52 connect the chip select circuit 48 to termination areas 9A and 11A, respectively, on the back edge of the processor motherboard 27 to control read and write operations between the back plane 35 and the I/O modules 21. The timing circuit 50 is connected by a strobe line 72 to termination area 7A to provide timing signals during the transfer of data to output modules 21. An I/O reset line 73 connects the timing circuit 50 to termination area 13A on the back edge of the motherboard 27 to provide an I/O reset signal of the type familiar in the art. An active signal on this line deenergizes all of the output devices on the controlled apparatus.

As data is coupled between the RAM 42 and the I/O modules 21 through the data bus 41 and the buffers 70, the parity of the data is checked by a parity checker 74. The parity checker 74 is coupled to the connecting two-way branch 41d of the data bus 41 to receive data entering and leaving the RAM 42. The parity checker 74 calculates the parity of this data when it is read into the RAM 42 and generates a signal through a "parity in" line 75 so that a parity bit is stored in the RAM 42 for that data. The parity checker also calculates the parity of data read out of the RAM 42 and compares it to the stored parity received through a parity out line 76. If a parity error is detected, the parity checker 74 generates a signal on a parity line 77 coupling it to the timing circuit 50. Various error status and error interrupt circuitry is included in the timing circuit 50, and this circuitry will generate a signal on an NMI line 78 to interrupt the execution of a current routine by the microprocessor 39.

It should be apparent from this description that the processor module 20 performs timing, buffering, decoding and parity checking functions as data is coupled between it and the I/O modules 21.

Suppose, for example, as shown in FIG. 2, it is desired to expand the capacity of the controller 10 due to the addition of another production line with a second incoming conveyor 13a, a second case palletizer 12a, and a second outgoing conveyor 16a. For the purpose of illustrating the invention only, it shall be assumed that the controller 10 of FIG. 1 is to be expanded by adding a second rack enclosure 19a with I/O modules 21 (as seen within the enclosure 11 in FIG. 2) and a separate processor unit 80 with greater processing capability than the processor module 20 of FIG. 2. As seen in FIG. 2, the processor module 20 in the lead slot 26 of the rack enclosure 19 in the foreground is replaced by a rack adapter module 81. This converts the rack unit 19 from a processor rack to an I/O interface rack. The second I/O interface rack 19a also has a rack adapter module 81 in its lead slot. A first communication cable 82 connects the separate processor unit 80 to an upper pin-style connector 83 on the rack adapter module 81 of the I/O interface rack 19 in the foreground of FIG. 2. A second communication cable 84 is connected at one end to the lower pin-style connector 85 of the foreground rack 19 and is connected at its other end to the upper pin-style connector of the I/O interface rack 19a in the general purpose enclosure 11. The separate processor unit 80 houses a main power supply 85 in its left one-third portion and this power supply 85 is connected to the I/O interface racks 19 and 19a through a pair of power cables 86. The separate processor unit 80 also houses a processor interface module 87, a controller processor module 88 and a memory module 89 which form the circuit in FIG. 6.

Figure 6:
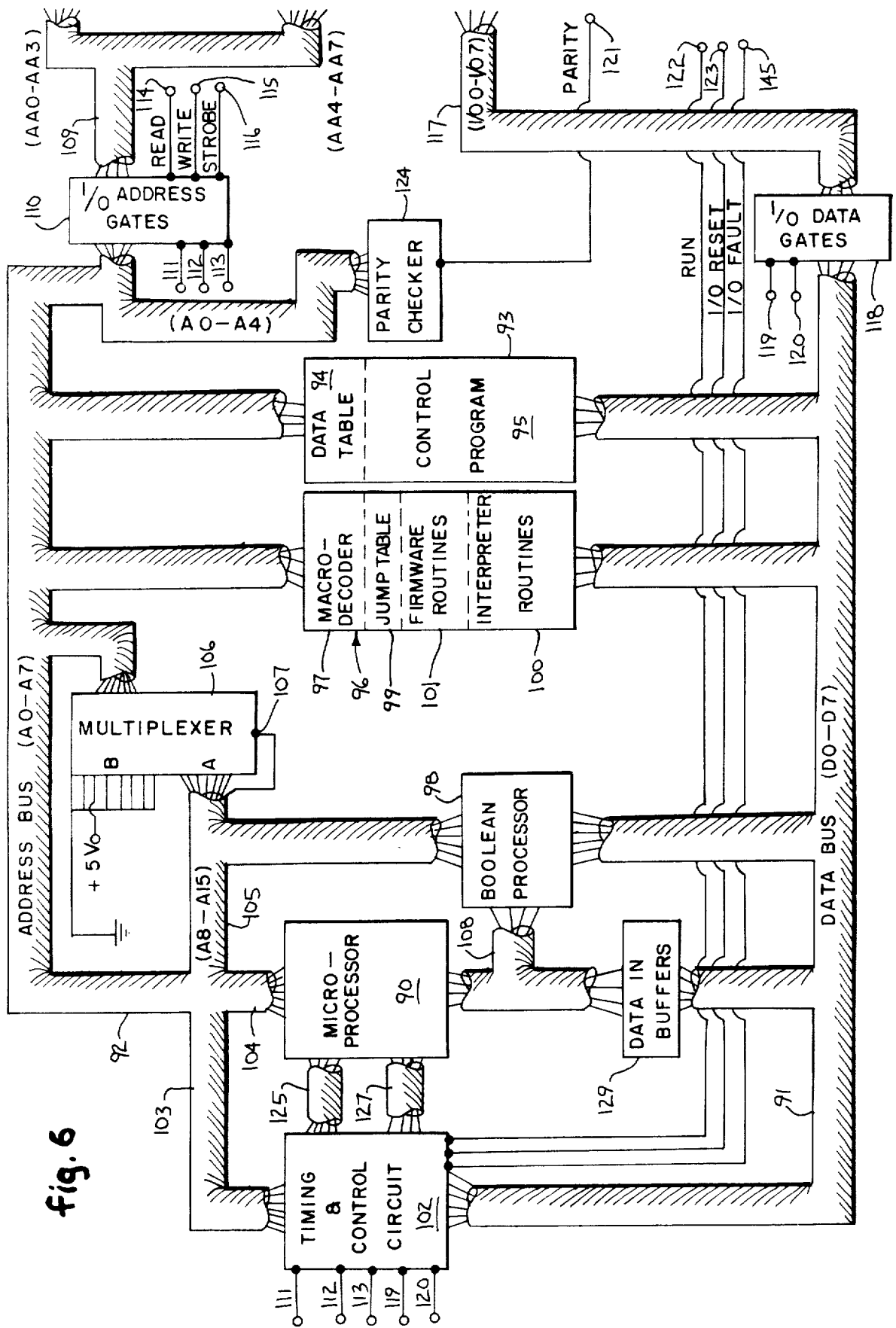
FIG. 6 is a block diagram of the separate processor unit of FIG. 2.

Referring now to FIG. 6, the circuit modules 87–89 of the separate processor unit 80 include a microprocessor 90 that is connected to other parts of the processor unit 80 through an eight-line (D0–D7) bidirectional data bus 91 and a sixteen-line (A0–A15) address bus 92. A random access memory (RAM) 93 connects to both the data bus 91 and the address bus 92 and includes from 512 to 8k lines of memory, depending on the size of the control program to be stored. The RAM 93 stores I/O status data in data table 94 in its first 256 lines and the RAM 93 stores a control program 95 comprised of a number of programmable controller-type instructions in its remaining lines.

The microprocessor 90 is also connected through the data bus 91 and the address bus 92 to an interpreter memory 96, which is a programmable read-only memory (PROM) that stores up to 2,048 machine instructions. The microprocessor 90 repeatedly executes a macro-instruction decoder routine 97 stored in the interpreter PROM 96 to fetch and execute control program instructions stored in the RAM 93. Bit-oriented instructions of the type customarily used in programmable controllers, such as XIC, XIO, OTE, OTD, OTL and OTU, are decoded and executed with the assistance of special hardware shown in FIG. 6 as a Boolean processor 98. A mapping table 99 in the interpreter PROM 96 is employed to couple other controller-type instructions to interpreter routines 100 in the PROM 96. The mapping table 99 contains starting addresses for associating macro-instruction interpreter routines 100 stored at higher addresses in the interpreter PROM 96. When required by the type of instruction fetched from the RAM 93, the macro-instruction decoder routine 97 addresses a line in the mapping table 99 that has a jump instruction to the starting address of the appropriate macro-instruction interpreter routine. The PROM 96 also stores general firmware routines 101 which perform the I/O scan and other routines. While the general operation of this processor unit 80 resembles the operation of the processor module 20 of FIG. 5, there are several important differences pointed out in the copending application of Brown et al, Ser. No. 43,897, cited above.

Still referring to FIG. 6, the microprocessor 90 in the separate processor unit 80 is an eight-bit, 72-instruction, LSI chip manufactured by the Intel Corporation and sold as the Model 8080. Details of the internal structure, the operation and the instruction set for this microprocessor are given in a publication entitled "Intel 8080 Microcomputer System Users Manual," dated September, 1975. This microprocessor 90 is connected to the hardwired Boolean processor 98, and to a timing and control circuit 102, through the main address bus 18, which is divided into a number of branches. One branch 103 that includes leads AB1, AB2, AB13, AB14 and AB15 connects to the timing and control circuit 102. Another branch 104 that includes leads AB0–AB15 connects to the microprocessor 90, and a third branch 105 that includes leads AB8–AB15 connects to the A inputs on a multiplexer 106 and to inputs on the Boolean processor 98. Lead AB15 in the third branch 105 connects to a select terminal 107 on the multiplexer 15, and depending on its logic state, the leads AB8–AB15 in the address bus 92 are coupled to either the third branch 105 or to a constant that is applied at the B inputs of the multiplexer 106.

When data is written into or read from the first 256 lines of the RAM 93, the lines AB8–AB14 in the third branch 105 are free to convey control information to the Boolean processor 98. The Boolean processor 98 responds to this control information to manipulate single bits of data that are selected from bytes of data received from the microprocessor 90 through a microprocessor data bus 108. The data bus 91 is connected to the output of the Boolean processor 98 and is also connected through a set of data in buffers 129 to the microprocessor data bus 108. Incoming data is received by the microprocessor 90 through the data bus 91 and data is output by the microprocessor 90 to the main data bus 91 through the Boolean processor 98.

The control program stored in the RAM 93 is repeatedly executed, or scanned, under the control of the microprocessor 90 when the controller unit 80 is in the RUN mode. Each execution cycle typically requires 20 milliseconds, although the exact time depends on the length of the control program 95 and the types of instructions included. After each execution cycle, an I/O scan routine is executed to couple data between the data table 94 in the RAM 93 and the I/O interface racks 19 and 19a.

The microprocessor 90 generates I/O address signals on a portion (lines A0-A4) of the main address bus 92. These signals are coupled to an I/O address bus 109 (lines AA0-AA7) through a set of I/O address gates 110. The I/O address gates 110 are enabled through an I/O select line 111, to couple signals on a write output line 112 and a memory request line 113. These lines 111-113 couple signals from the timing and control circuit 102 to the I/O address gates 110, where the write output line 112 and the memory request line 113 are further coupled to a read line 114, a write line 115 and a strobe line 116.

Data is coupled between the main data bus 92 and an eight-line (I/O 0-I/O 7) I/O data bus 117 through a set of I/O data gates 118. The timing and control circuit 102 is coupled to the I/O data gates 117 through a bus enable control line 119 and a receiver latch enable line 120 to enable the gates 118. The read line 114 and the bus enable control line 119 are activated when data is to be coupled to the main data bus 91 from the I/O data bus 117. On the other hand, the write output line 112, the write line 115 and the receiver latch enable line 120 are activated when the data is coupled from the main data bus 91 to the I/O data bus 116.

Besides the I/O buses 109 and 117, and the control lines 114-116 mentioned thus far, several other control lines in FIG. 6 are coupled to the rack adapter module 81 in FIG. 7. These include a parity line 121, a RUN line 122 and an I/O reset line 123. Signals on the parity line 121 are generated by a parity checker 124 that is coupled to lines A0-A4 of the main address bus 91. The RUN line 122 and the I/O reset line 123 couple signals from the timing and control circuit 102 to the rack adapter module 81 of FIG. 7. The timing and control circuit 102 generates these control signals from signals that are coupled between it and the microprocessor 90 through a control input bus 125 and a control output bus 127 seen in FIG. 6.

Referring to FIGS. 2, 6 and 7, the various lines described above are coupled between the separate processor unit 80 and the rack adapter module 81 of FIG. 2 through the pin-style connector 83 that connects to the front edge of a rack adapter circuit board 126. The back edge of the circuit board 126 seen in FIG. 7 has a plurality of termination areas 128 that are electrically connected to an edge connector 33 seen in FIG. 3.

From the description that follows, it shall be apparent that the rack adapter module 81, FIGS. 2 and 7, buffers data, checks the parity of data received from either direction, decodes I/O module addresses to enable a selected I/O module 21, and couples miscellaneous control signals such as the I/O reset signal and a last state signal to control the status of output devices on the I/O modules 21. The read, write, and strobe signals are also buffered as they are coupled between the front and back edges of the rack adapter circuit board 126. To the extent the above-described functions are necessary in the controller 10 of FIG. 1, they are provided by the processor module 20 seen in FIGS. 1, 3 and 5. The processor module 20 of FIG. 1 not only performs these necessary functions but generates the same signals at the same pin locations of the edge connector 33 of FIG. 4 as the rack adapter module 81 to be described. In the present invention the edge connector 33 in combination with the back plane 35 form a universal connector for receiving either the processor module 20 of FIG. 1 or the rack adapter module 81 of FIG. 2.

Referring now to FIG. 7, the read line 114, the write line 115 and the strobe line 116 are coupled through a set of buffers 130 and a set of NAND gates 131 to termination areas 11A, 9A and 7A, respectively. The I/O data bus 117 is divided with lines I/O 0-I/O 3 coupled to one set of buffers 132 and lines I/O 4-I/O 7 coupled to another set of buffers 133. Each of these portions of the I/O data bus 117 is further divided into a one-way data in branch 117a and 117b and a one-way data out branch 117c and 117d. The data out branches 117c and 117d are coupled through two sets of buffers 134 and 135, so that lines I/O 0-I/O 7 are coupled to termination areas 15A-22A on the back edge of the rack adapter circuit board 126. The data in branches 117a and 117b of the I/O data bus 117 are coupled back from these buffers 134 and 135 to a pair of latches 136 and 137 and to a parity checker 138. The data in branches 117a and 117b for lines I/O 0-I/O 7 are further coupled from the outputs of the latches 136 and 137 back to the first two sets of buffers 132 and 133. These input buffers 132 and 133 are enabled by signals on the read line 114, while the output buffers 134 and 135 are enabled by signals on the write line 115. The latches 136 and 137 are enabled by signals on the strobe line 116, which connects to an input on each of the latches 136 and 137.

When data is written out to the I/O modules 21 through the rack adapter module 81, it is coupled through an ungated portion of the buffers 132 and 133 and coupled through buffer gates in buffers 134 and 135, these gates being enabled by a signal on the write line 115. When data is read from the I/O modules 21 through the rack adapter module 81, data signals are coupled through an ungated portion of the buffers 134 and 135 into the latches 136 and 137 and into the parity checker 138. The input buffers 132 and 133 are enabled by a signal on the read line 114 while the outputs on the latches 136 and 137 are enabled by a signal on the strobe line 116, to read input data from the latches 136 and 137.

The parity of output data coupled through the buffers 134 and 135 is checked by the parity checker 138 which receives the data through the data in branches 117a and 117b. A parity signal is coupled from an output on this parity checker 138 to an input on another parity checker 139. The output data is not coupled to the latches 136 and 137, however, as they are disabled during a write operation. When data is read from the I/O back plane 35 and coupled to the latches 136 and 137, it is also coupled to the parity checker 138 which generates a parity signal to the other parity checker 139.

Lines AA0-AA3 of the I/O address bus 109 carry signals which are decoded to enable a selected I/O module 21 in an I/O interface rack. These lines AA0-AA3 are coupled through a set of buffers 140 to a four-line-to-sixteen-line decoder 141, and the outputs of the decoder are connected through I/O module select lines 142 and termination areas 35A-50A to the I/O back plane. The read line 114 and the write line 115 are coupled through an EXOR gate 151 and an inverter 152 to an enabling input on the decoder 141 to enable the coupling of a slot enable signal to the back plane. Again, although the adapter module 81 can interface sixteen I/O modules 21, in this instance, only eight I/O modules 21 are included in each I/O interface rack 19 and 19a.

The parity of the module select data is checked by the parity checker 139, which is coupled to lines AA0-AA3 of the I/O address bus 109. The parity line 121 coming from the processor module 20 is also coupled to this parity checker 139 through a set of buffers 143, and the two other inputs on the parity checker 139 are coupled to the read line 114 and the write line 115. Thus, it can be seen that the parity checker 139 generates signals from a pair of outputs that are responsive to parity errors in input data, output data, and module select data, whether the latter data includes an erroneous signal generated on the processor module 20 or on the rack adapter module 81.

When a parity error occurs, a parity error signal is generated at one output of the parity checker 139 through an AND gate 144 to the I/O fault line 145, to signal an I/O fault to the processor module 20. Another error signal is coupled from another output on the parity checker 139 through two AND gates 146 and 147 to the NAND gates 131 to disable the write line 115 and the strobe line 116 and to prevent any data from being coupled between the I/O modules 21 and the processor unit 80.

In the expanded controller with multiple I/O interface racks 19 and 19a, rack select signals are coupled on lines AA4-AA7 of the I/O address bus 109 through a set of buffers 148 on the rack adapter module 81 to a set of B inputs on a comparator 149. A rack select switch 150 is coupled to the A inputs on the comparator 149, and this switch 150 is set to generate a number corresponding to the identity of the rack in which the rack adapter module 81 is disposed. When an address signaled to the rack adapter module 81 contains valid rack and I/O module addresses, the comparator 149 will generate a signal from an output that is coupled to AND gates 146 and 147.

The I/O reset line 123 is coupled through the buffers 143, an inverter 154 and one input of a two-input NAND gate 155 having its other input coupled to a LAST STATE line 156. If the I/O devices remain in their last state, this NAND gate 155 remains disabled, however, if the I/O devices are to be reset, this NAND 155 gate is enabled by a signal on the LAST STATE line 156. The output of this NAND gate 155 and the RUN line 122, which is also coupled through the buffers 143, are coupled to two inputs on a low true NAND gate 157. A signal is coupled from the output of this NAND gate 157 to termination area 13A on the I/O back plane when the I/O devices are to be reset. The "last state" option is not available when the controller is in other than its RUN mode, and therefore, a false signal on the RUN line 122 will generate an I/O reset signal from the output of the NAND gate 157. The I/O reset line is also connected through AND gate 147 to the output gates 131 to decouple the write line 115 and the strobe line 116 from the I/O back plane while the I/O reset signal is being applied.

As seen from a comparison of FIGS. 1 and 2, the invention eliminates hardware by integrating the portions of the rack adapter module 81 into the processor module 20. This provides a new small controller with the unique aspect of expandability discussed above.

I claim:

1. An expandable programmable controller comprising:
   a rack forming an I/O slot and a lead slot, and having an I/O back edge connector disposed in the I/O slot and universal back edge connection means disposed in the lead slot and electrically coupled to the I/O back edge connector for connecting either a processor module or a rack adapter module to an I/O module;
   an I/O interface module disposed in the I/O slot, the I/O interface module including a circuit board with a front edge adapted to be connected to I/O devices on a controlled system and with a back edge connected to the back edge connector in the I/O slot, the I/O interface module having circuits with logic states determined according to the status of the I/O devices; and
   a processor module removably disposed in the rack with a back edge connected to the universal back edge connection means, the processor module being operable to monitor and control the circuits in the I/O interface module under the direction of a control program.

2. The controller of claim 1, wherein:
   the I/O interface module includes an I/O enable line, data bus lines, and read, write, strobe and I/O reset lines;
   wherein the universal back edge connection means has contacts coupled to the lines in the I/O module through a back plane circuit board, including a contact connected to an I/O module enable line, a plurality of contacts connected to data bus lines, and other contacts connected to read, write, strobe and I/O reset lines; and
   wherein the processor module has an I/O module enable line, data bus lines and read, write, strobe and I/O reset lines that terminate along a back edge and are spaced for connection to corresponding contacts of the universal back edge connection means.

3. An expandable programmable controller comprising:
   a rack forming an I/O slot and a lead slot, and having an I/O back edge connector disposed in the I/O slot and a dual-purpose back edge connector disposed in the lead slot and electrically coupled to the I/O back edge connector;
   an I/O interface module disposed in the I/O slot, the I/O interface module including a circuit board with a front edge adapted to be connected to I/O devices on a controlled system and with a back edge connected to the back edge connector in the I/O slot, the I/O interface module having circuits with logic states determined according to the status of the I/O devices; and
   a processor module or a rack adapter module removably disposed in the rack with a back edge connected to the dual-purpose back edge connector, the processor module, when selected, being operable to monitor and control the circuits in the I/O interface module under the direction of a control program, and the rack adapter module, when selected, being operable to condition electrical signals coupled to and from the I/O interface module.

4. An expandable programmable controller comprising:
   an I/O interface rack with a plurality of I/O modules disposed therein that are adapted to be connected to I/O devices on a controlled system, the rack having a lead slot adapted to receive another module, and the I/O modules being connected through control lines, data bus lines, and respective I/O module enable lines to a universal edge connector in the lead slot; and
   a processor module having
   (a) memory means for storing I/O status data and a control program comprised of program instructions,
   (b) processor means for operating on I/O status data according to the program instructions, the processor means being operable to read and execute program instructions, being operable to transfer data to and from other circuitry on the processor module, and being operable to generate read and write control signals and address signals associated with data transfer,
   (c) decoding circuit means coupled to the processor means for receiving and decoding address signals from the processor to generate I/O module enable signals, (d) data buffer means for conditioning data signals, (e) a data bus coupled at one end to the processor means and the memory means and coupled at another end to the data buffer means, and (f) a circuit board mounting the processor means, the memory means, the decoding circuit means, and the buffer means, and having a back edge and a plurality of termination areas therealong for connection to the universal edge connector in the lead slot, a first group of termination areas being connected to the decoding circuit means to couple I/O module enable signals, a second group of termination areas being connected to the data buffer means to couple data, and a third group of termination areas being coupled to the processor means to couple control signals, wherein the processor module is removably connected to the universal edge connector to form an expandable programmable controller.

5. An expandable programmable controller adapted for use with a separate processor and a rack adapter module having an enable line, data bus lines, and control lines, the controller comprising:

modular I/O circuit means for monitoring and controlling I/O devices, the I/O circuit means having lines that terminate along its front edge for connection to I/O devices on a controlled system, and having an enable line, data bus lines and control lines that terminate along its back edge;

modular processor means having a back edge and (a) a memory for storing data and a control program comprised of program instructions, (b) a main processor operable to generate address signals and control signals to couple data and program instructions from addresses in memory, (c) data bus lines coupling the main processor to the memory, the data bus lines being terminated along the back edge of the modular processor means, (d) decoding circuit means for generating enabling signals in response to address signals from the main processor, (e) an address bus with lines coupling the main processor to both the memory and the decoding circuit means, (f) I/O module enable lines connected to the decoding circuit means and terminated along the back edge of the modular processor means, and (g) control lines coupled to the main processor and terminated along the back edge of the modular processor means; and a rack in which the modular processor means and the modular I/O circuit means are removably disposed, the rack including means for electrically connecting the enable line of the modular I/O circuit means to a corresponding one of the I/O module enable lines on the modular processor means or on the rack adapter module, and further including means for connecting the data bus lines and the control lines of the modular I/O circuit means to those of the modular processor means or to those of the rack adapter module.

6. The controller of claim 5, wherein the modular processor means further includes parity checking means coupled to the memory for checking the parity of data that is coupled from the memory to the rack connection means through the data bus lines.

7. A programmable controller system for conversion between a single-rack controller and a controller with distributed components, the system comprising:

modular I/O circuit means for monitoring and controlling I/O devices, the I/O circuit means having lines that terminate along its front edge for connection to I/O devices on a controlled system, and having an I/O module enable line, data bus lines and control lines that terminate along its back edge;

a processor unit having address bus lines, data bus lines and control lines terminated in a mass input/output termination;

modular rack adapter circuit means having address bus lines, data bus lines and control lines that terminate along its front edge for connection to the processor unit, and having I/O module enable lines, data bus lines and control lines that terminate along its back edge for connection to the modular I/O circuit means;

means for connecting the lines terminated on the front edge of the rack adapter circuit means to corresponding lines terminated in the mass termination on the processor unit;

modular processor circuit means having I/O module enable lines, data bus lines and control lines that terminate along its back edge; and a rack having a lead slot adapted to receive the modular processor means, having a universal edge connector disposed in the lead slot to connect to the back edge of the modular processor means, the lead slot also being adapted to receive the rack adapter circuit means and the universal edge connector also being adapted to connect to the back edge of the rack adapter circuit means, the rack also having another slot adapted to receive the modular I/O circuit means and having another edge connector disposed in the other slot to connect to the back edge of the modular I/O circuit means, and the rack including back plane means for mounting the edge connectors and for electrically interconnecting one I/O module enable line, the data bus lines and the control lines from a selected modular circuit means in the lead slot to corresponding lines on the modular I/O circuit means in the other slot.

* * * * *